(12) United States Patent
Noguchi et al.

(10) Patent No.: US 7,514,146 B2
(45) Date of Patent: Apr. 7, 2009

(54) MULTILAYER SUBSTRATE, METHOD FOR PRODUCING A MULTILAYER SUBSTRATE, AND DEVICE

(75) Inventors: Hitoshi Noguchi, Gunma (JP); Atsuhito Sawabe, Lions Mansion Syonan Akiya 302, 21-1, Akiya 2-chome, Yokosuka-shi, Kanagawa-ken (JP)

(73) Assignees: Shin-Etsu Chemical Co., Ltd., Tokyo (JP); Atsuhito Sawabe, Yokosuka (JP)

( * ) Notice: Subject to any disclaimer, the term of this patent is extended or adjusted under 35 U.S.C. 154(b) by 295 days.

(21) Appl. No.: 11/368,617

(22) Filed: Mar. 7, 2006

(65) Prior Publication Data

US 2006/0203346 A1 Sep. 14, 2006

(30) Foreign Application Priority Data

Mar. 14, 2005 (JP) .............................. 2005-071924

(51) Int. Cl.
*C30B 29/04* (2006.01)
(52) U.S. Cl. ............... 428/408; 204/192.1; 204/192.12; 204/192.15; 427/249.1; 427/249.8; 427/249.14; 427/404; 427/577; 428/457; 428/469; 428/472
(58) Field of Classification Search ................ 428/408, 428/457, 469, 472; 117/929; 423/446; 204/192.1, 204/192.12, 192.15; 427/249.1, 249.8, 249.14, 427/404, 577
See application file for complete search history.

(56) References Cited

U.S. PATENT DOCUMENTS

| 5,993,919 | A | 11/1999 | Tsuno et al. |
| 6,080,378 | A * | 6/2000 | Yokota et al. ............... 423/446 |
| 6,383,288 | B1 * | 5/2002 | Hayashi et al. ............. 117/929 |
| 2004/0069209 | A1 | 4/2004 | Golding et al. |

FOREIGN PATENT DOCUMENTS

EP 0 846 792 A1 6/1998

(Continued)

OTHER PUBLICATIONS

Tsubota et al "Heteroepitaxial growth of diamond on an iridium (100) substrate using microwave plasma-assisted chemical vapor deposition" Diamond and Related Materials 9 (2000) 1380-1387.*

(Continued)

*Primary Examiner*—Archene Turner
(74) *Attorney, Agent, or Firm*—Oliff & Berridge, PLC (57) ABSTRACT

There is provided a multilayer substrate comprising, at least, a single crystal MgO substrate, an iridium (Ir) film heteroepitaxially grown on the MgO substrate, a diamond film vapor-deposited on the Ir film, wherein crystallinity of the Ir film is that a full width at half maximum (FWHM) of a diffracted intensity peak in $2\theta=46.5°$ or $2\theta=47.3°$ attributed to Ir (200) analyzed by X-ray diffraction method with a wavelength of $\lambda=1.54$ Å is 0.40° or less. Thereby, there is provided a multilayer substrate that is delamination-proof at the respective interfaces between the MgO substrate and the Ir film and between the Ir film and the diamond film, and, particularly, that has a single crystal diamond film of a large area as a continuous film.

12 Claims, 5 Drawing Sheets

FOREIGN PATENT DOCUMENTS

JP          A 2001-278691          10/2001

OTHER PUBLICATIONS

Fujisaki et al "Fabrication of heteroepitaxial diamond films on Ir(001)/MgO(001) substrates using antenna-edge-type microwave plasma-assisted chemical vapor deposition" Diamond and Related materials 11 (2002) 478-481.*

Shintani et al; "Growth of highly (111)-oriented, highly coalesced diamond films on platinum (111) surface: A possibility of heteroepitaxy"; vol. 11; No. 12; Dec. 1996; pp. 2955-2956.

Ohtsuka et al; "Epitaxial Growth of Diamond on Iridium"; vol. 35; No. 8B; Aug. 1996; pp. L1072-L1074.

* cited by examiner

(A) | Step of heteroepitaxial growth of IR film on MgO substrate |

(B) | Step of pretreatment |

(C) | Step of vapor-deposition of diamond film |

MULTILAYER SUBSTRATE, METHOD FOR PRODUCING A MULTILAYER SUBSTRATE, AND DEVICE

BACKGROUND OF THE INVENTION

1. Field of the Invention

The present invention relates to a multilayer substrate used for production of devices and such, and particularly a multilayer substrate having a diamond film.

2. Description of the Related Art

Diamond has a wide band gap of 5.47 eV and a very high dielectric breakdown electric field intensity of 10 MV/cm. Furthermore, it has the highest thermal conductivity in materials. Therefore, if this is used for an electric device, the device is advantageous as a high output power device.

Furthermore, diamond has high drift mobility and is the most advantageous as a high-speed power device in semiconductors in comparison of Johnson performance index.

Accordingly, diamond is said to be the ultimate semiconductor suitable for high frequency/high power electric devices.

Therefore, a multilayer substrate in which a diamond film and the like is laminated on a substrate has attracted attention.

Now, most of the single crystal diamonds for producing diamond semiconductors are referred to as Ib type formed by high-pressure method. These Ib-type diamonds contain much impurity of nitrogen and can only be obtained at a size of no more than about a 5-mm square and are low in utility.

By contrast, Chemical Vapor Deposition (CVD) method has an advantage that a diamond film of polycrystalline diamond of a large area having a diameter of about 6 inches (150 mm) can be obtained with high purity. However, in the CVD method, it has been conventionally difficult to perform single crystallization suitable for general electric devices. This is caused by a single crystal Si having been used as a substrate conventionally. That is, this is because Si and diamond are very different in lattice constant (mismatch between them is 52.6%) and it is very difficult to heteroepitaxially grow diamond on a silicon substrate.

Therefore, various kinds of studies has progressed and there is a report that it is effective that Pt or Ir is formed as a ground film, and then a diamond film is formed thereon by CVD method (see, for example, Y. Shintani, J. Mater. Res. 11, 2955 (1996), and K. Ohtsuka, Jpn. J. Appl. Phys. 35, L1072 (1996)).

In the current situation, the research relating to Ir has particularly progressed most. There is a method in which, first, by using a single crystal MgO as a substrate, an Ir film is heteroepitaxially grown thereon, and next by DC plasma method, the Ir film surface is pretreated by ion irradiation with a methane gas diluted by hydrogen, and a diamond film is grown on the Ir film. Thereby, there have been obtained diamonds having a conventional submicron size to a recent several millimeters' size.

However, linear expansion coefficients of the MgO substrate, the Ir film, and the diamond film are $13.8 \times 10^{-6}$ $K^{-1}$, $7.1 \times 10^{-6}$ $K^{-1}$, and $1.1 \times 10^{-6}$ $K^{-1}$, respectively. The difference of them is large. Therefore, there has been caused delamination at the respective interfaces between the MgO substrate and the Ir film and between the Ir film and the diamond film. In the present situation, it is being studied to form a diamond film having a large area of a 10-mm-square size or a 25-mm-diameter size. However, there is a problem that a film having even a 10-mm-square size does not become a continuous film, and only, films having about several millimeters size weakly adhere in a discontinuous manner or the film is occasionally delaminated in about several millimeters' pieces.

SUMMARY OF THE INVENTION

The present invention was accomplished in order to solve the aforementioned problems, and its object is to provide a multilayer substrate that is delamination-proof at the respective interfaces between a MgO substrate and an Ir film and between an Ir film and a diamond film, and particularly that has a single crystal diamond film of a large area as a continuous film.

The present invention was accomplished in order to solve such problems, and provides a multilayer substrate comprising, at least, a single crystal MgO substrate, an iridium (Ir) film heteroepitaxially grown on the MgO substrate, and a diamond film vapor-deposited on the Ir film, wherein crystallinity of the Ir film is that a full width at half maximum (FWHM) of a diffracted intensity peak in $2\theta=46.5°$ or $2\theta=47.3°$ attributed to Ir (200) analyzed by X-ray diffraction method with a wavelength of $\lambda=1.54$ Å is $0.40°$ or less.

The Ir film of the multilayer substrate provided by the present invention as described above is good in crystallinity and has a desired physical property such as a linear expansion coefficient and a lattice constant which are close to that of a perfect single crystal Ir. Therefore, in the multilayer substrate of the present invention, it is difficult to cause delamination at the respective interfaces between the MgO substrate and the Ir film and between the Ir film and the diamond film. Therefore, the multilayer substrate of the present invention can have a diamond film of a large area such as a 10-mm square or more as a continuous film.

In the multilayer substrate of the present invention, it is preferable that a stress in the Ir film is a compression stress of $1 \times 10^2$-$1 \times 10^4$ MPa.

As the Ir film stress, a tensile stress is desirable for reducing warpage in the case of forming the diamond film on the Ir film. However, it is inevitable that the stress polarity changes from tensile to compressive since there is the difference of linear expansion coefficient between MgO and Ir. As a multilayer substrate of the present invention, if the substrate is that the stress of the Ir film is a compression stress of $1 \times 10^2$-$1 \times 10^4$ MPa, delamination can be more certainly prevented at the respective interfaces between the MgO substrate and the Ir film and between the Ir film and the diamond film.

Moreover, in the multilayer substrate of the present invention, it is preferable that a thickness of the Ir film is 1.5 μm or less.

If the thickness of the Ir film is more than 1.5 μm, defects having projection shape are occasionally generated and there is a fear that in the case of growing the diamond film on the defect-generated Ir film, projection-shaped defects are also generated on the diamond film. Accordingly, by making the thickness of the Ir film 1.5 μm or less as described above, defects generated in the Ir film can more certainly prevented. As a result, a single crystal diamond film of higher quality can be obtained at high yield.

Moreover, the present invention provides a device produced by using the above-described multilayer substrate.

In the present invention as described above, there can be provided a multilayer substrate having a diamond film of higher quality. Therefore, by using such a multilayer substrate, devices of high quality can be produced at high yield.

Moreover, the present invention provides a method for producing a multilayer substrate comprising, at least, a step of heteroepitaxially growing an iridium (Ir) film on a MgO substrate and a step of vapor-depositing a diamond film on the Ir film, wherein the heteroepitaxial growth of the Ir film is performed by R.F. magnetron sputter method in a condition that the target is Ir, the substrate temperature is 600-1000° C., and the gas pressure is $3\times10^{-2}$-$1\times10^{-1}$ Torr (about 3.9-1.3×10 Pa).

According to the present invention, in the Ir film growth, the Ir film having good crystallinity and a desired physical property such as a linear expansion coefficient and a lattice constant which is close to that of a perfect single crystal Ir can be grown on the MgO substrate by controlling the substrate temperature and the gas pressure to the above ranges. This grown Ir film has a moderate film stress that can more certainly prevent the delamination at the respective interfaces between the MgO substrate and the Ir film and between the Ir film and the diamond film. Therefore, the diamond film vapor-deposited on the Ir film can be made to be a continuous film even if it is a large area such as a 10-mm square or more.

In the method of producing a multilayer substrate of the present invention, it is preferable that a thickness of the Ir film to be heteroepitaxially grown is 1.5 μm or less.

By making a thickness of the Ir film 1.5 μm or less, defects can be sufficiently prevented from being generated in the Ir film. As a result, a diamond film of high quality can be obtained.

In the method of producing a multilayer substrate of the present invention, it is preferable that the vapor deposition of a diamond film is performed by a microwave CVD method in a condition that the substrate temperature is 800-1000° C.

Thereby, there can be more certainly obtained a continuous film of single crystal diamond having little delamination and having a large area.

Moreover, in the method of producing a multilayer substrate of the present invention, it is preferable that after the step of the heteroepitaxial growth of an Ir film, a surface of the Ir film is pretreated by DC plasma method before the step of the vapor deposition of a diamond film.

It is thought that by pretreating a surface of the Ir film, nanosize diamond microparticles are formed on the surface of the Ir film. Therefore, it becomes easy to deposit subsequently the diamond film on the Ir film.

As explained above, according to the present invention, there can be provided a multilayer substrate having little delamination at the respective interfaces between a MgO substrate and an Ir film and between a Ir film and a diamond film, and particularly having a single crystal diamond film of a large area as a continuous film.

DETAILED DESCRIPTION OF THE PREFERRED EMBODIMENTS

Hereinafter, embodiments of the present invention will be described. However, the present invention is not limited to this.

As mentioned above, the conventional multilayer substrate had a problem that by the difference of film properties between an Ir film and a diamond film and so forth, delamination is easily caused at the respective interfaces between the MgO substrate and the Ir film and between the Ir film and the diamond film, and particularly a single crystal diamond film of a large area can not obtained as a continuous film.

Accordingly, the present inventors diligently studied for solving such a problem.

As a result, the present inventors found that if the crystallinity of an Ir film to be an intermediate layer of the multilayer substrate is good, delamination becomes difficult to be caused at the respective interfaces between the MgO substrate and the Ir film and between the Ir film and the diamond film and a diamond film of high quality can be obtained on the Ir film even if it has a large area. By examining carefully a condition for growing such an Ir film of good crystallinity, the present invention is accomplished.

Figure 1:
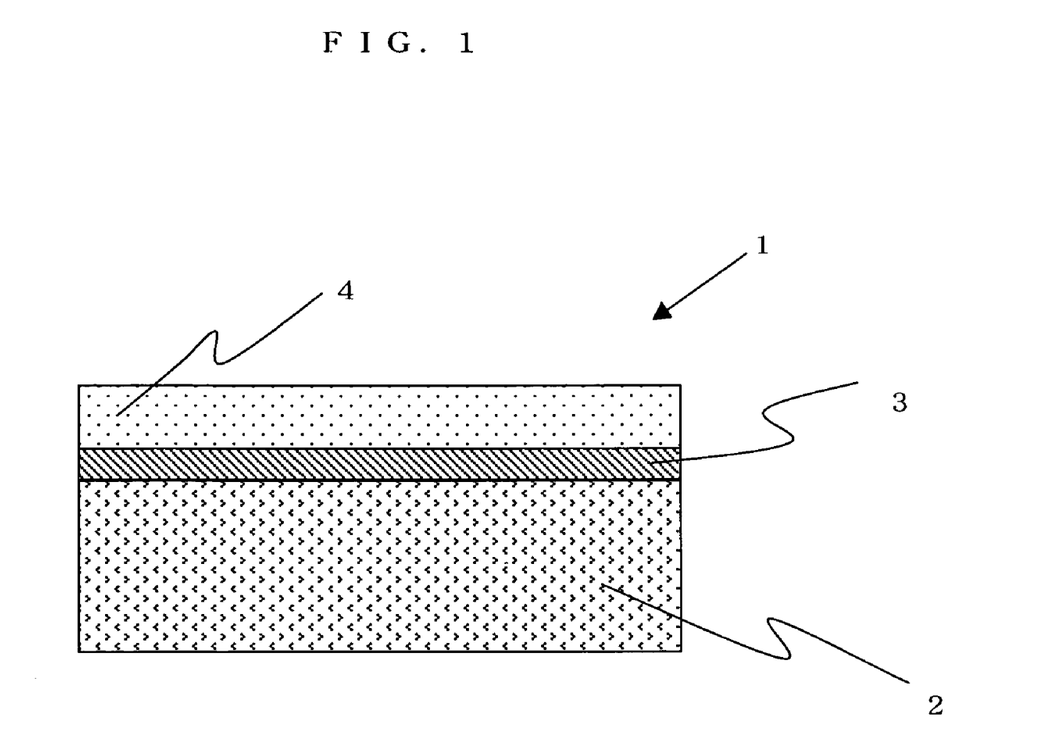
FIG. 1 is a schematic section view showing an example of a multilayer substrate of the present invention.

Here, an example of the multilayer substrate of the present invention is shown in FIG. 1. This multilayer substrate 1 has a single crystal MgO substrate 2, an iridium (Ir) film 3 heteroepitaxially grown on the MgO substrate 2, and a diamond film 4 vapor-deposited on the Ir film 3.

In the present invention, crystallinity of the Ir film 3 is that a full width at half maximum (FWHM) of a diffracted intensity peak in $2\theta=46.5°$ or $2\theta=47.3°$ attributed to Ir (200) analyzed by X-ray diffraction method with a wavelength of $\lambda=1.54$ Å is 0.40° or less. That is, in the multilayer substrate 1 of the present invention, the Ir film 3 has good crystallinity and a desired physical property such as a linear expansion coefficient or a lattice constant which is close to that of a perfect single crystal Ir. Therefore, the multilayer substrate 1 of the present invention is delamination-proof at the respective interfaces between the MgO substrate 2 and the Ir film 3 and between the Ir film 3 and the diamond film 4. Therefore, the substrate can have a diamond film of a large area such as a 10-mm square or more as a continuous film.

Moreover, as a stress of the Ir film 3, a tensile stress is desirable for reducing warpage in the case of forming the diamond film 4 on the Ir film 3. However, it is inevitable that the stress polarity changes from tensile to compressive. As the multilayer substrate 1 of the present invention, if the substrate is that the stress in the Ir film 3 is a compression stress of $1\times10^2$-$1\times10^4$ MPa, the delamination can be more certainly prevented in the respective interfaces between the MgO substrate 2 and the Ir film 3 and between the Ir film 3 and the diamond film 4.

Next, an example of a method for producing a multilayer substrate of the present invention as described above is shown as a flow chart in FIG. 2.

Figure 2:
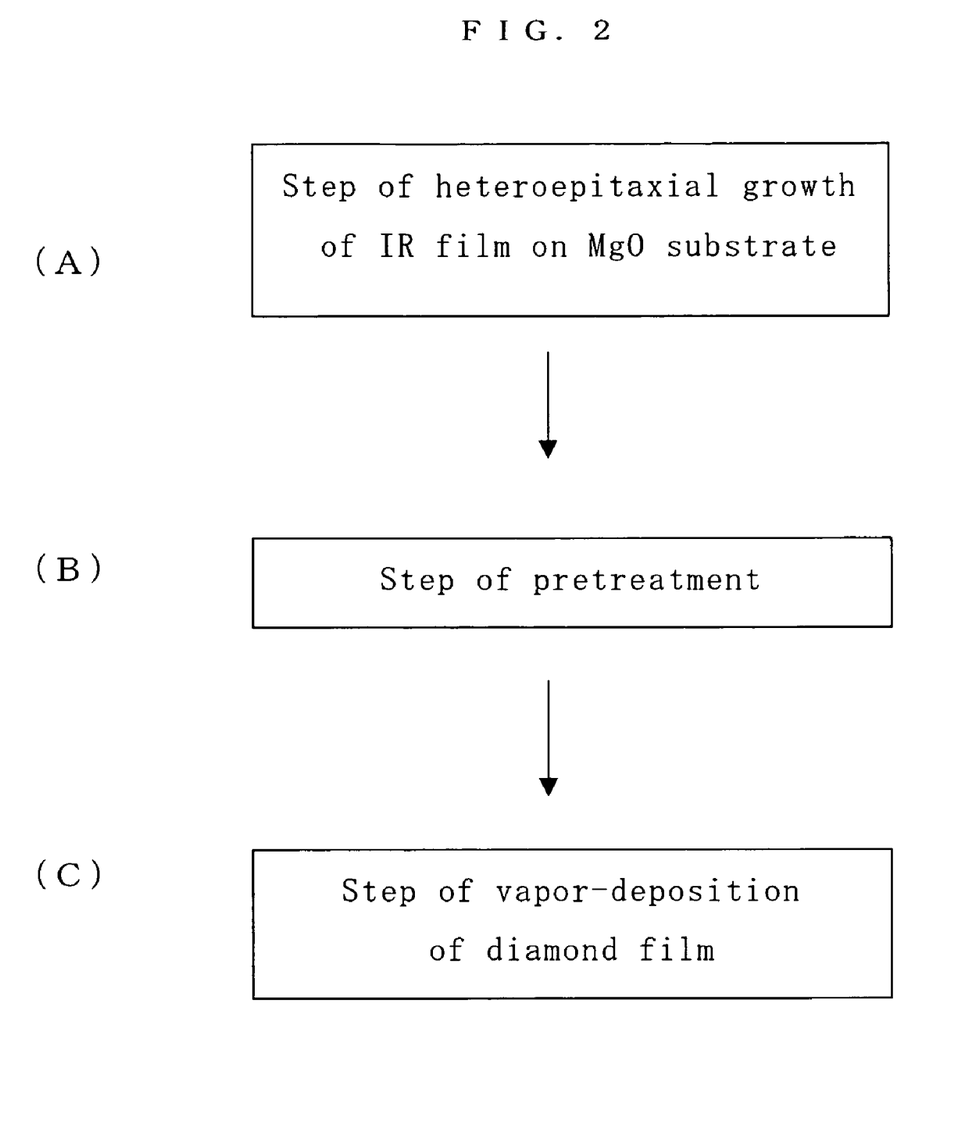
FIG. 2 is a flow chart showing an example of a method for producing a multilayer substrate of the present invention.

As shown in FIG. 2, the multilayer substrate of the present invention can be produced through a step (A) of heteroepitaxially growing an iridium (Ir) film on a MgO substrate and a step (C) of vapor-depositing a diamond film on the Ir film. As an optional step, after the step (A) of the heteroepitaxial growth of an Ir film, a step (B) of pretreating a surface of the Ir film by DC plasma method can be performed before the step (C) of the vapor deposition of a diamond film.

First, the step (A) of the heteroepitaxial growth of an Ir film will be explained.

Figure 3:
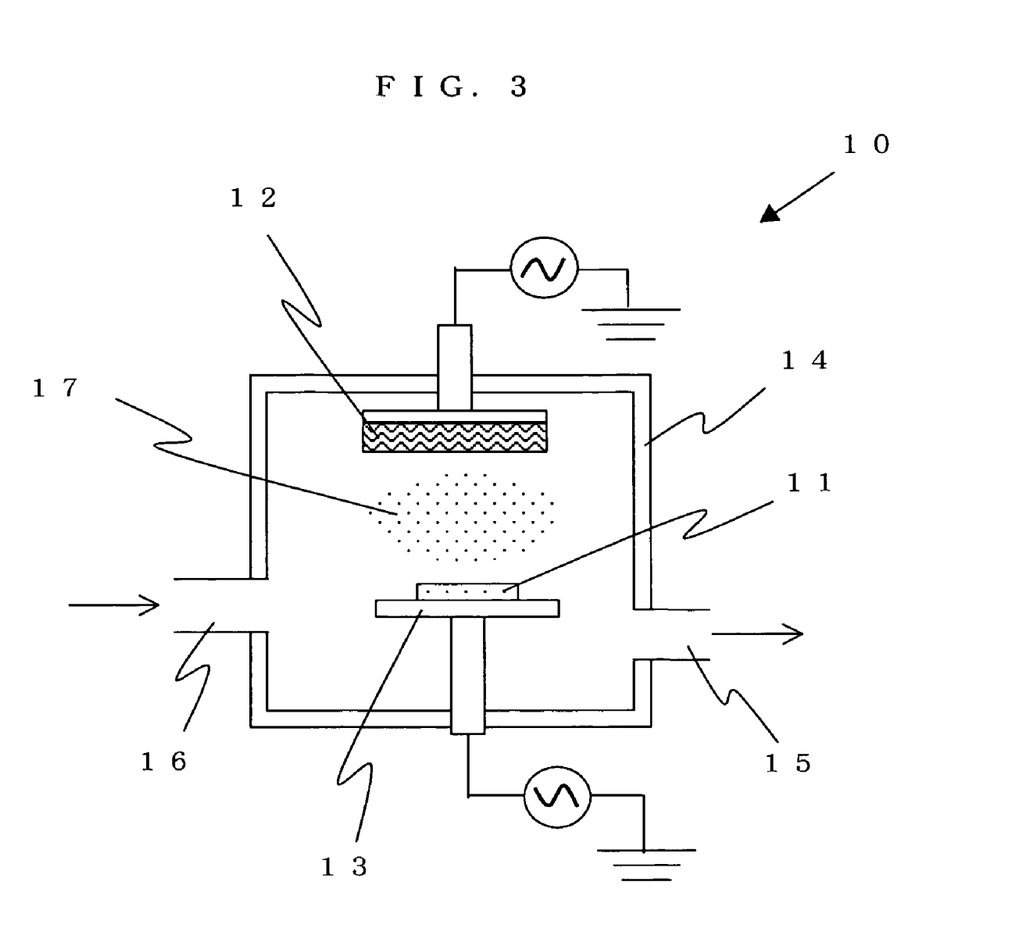
FIG. 3 is a schematic view of a sputter apparatus that is used in a producing method of the present invention.

The Ir film can be heteroepitaxially grown on a MgO substrate 11 by R.F. magnetron sputter method, for example, by using a sputter apparatus 10 as shown in FIG. 3.

As explaining the outline, the MgO substrate 11 is placed so as to face to a target electrode material 12 consisting of Ir and the target electrode material 12 is sputtered by plasma and thereby the Ir film is heteroepitaxially grown on the surface of the MgO substrate 11.

The detail will be explained. First, the target electrode material 12 consisting of Ir is put in the sputter apparatus 10 and the single crystal MgO substrate 11 is set on a resistance heating heater 13, and then exhaust is performed by vacuum pump from a gas outlet duct 15 and thereby the pressure in the chamber 14 is reduced to $10^{-7}$ Torr (about $1.3\times10^{-5}$ Pa). Next, heating is performed by a heater 13 so that the temperature of the substrate 11 becomes 600-1000° C. If the temperature is not within the range, it is difficult to perform epitaxial growth of the Ir film. Sequentially, vacuum exhaust is performed and the pressure in the chamber is reduced to $10^{-7}$ Torr again. Next, a gas (for example, argon: Ar) is introduced from an inlet duct 16 and electric discharge is performed by applying a voltage of 13.56 MHz to the electrode and thereby plasma 17 is generated, resulting in epitaxially growing the Ir film on the MgO substrate. A gas pressure in the chamber 14 is made to be in the range of $3\times10^{-2}$-$1\times10^{-1}$ Torr. If it is not made to be within the pressure range, tensile stress of the Ir film to be grown is so strong that the film is delaminated or it cannot be grown so as to have a desired crystallinity.

Moreover, in this case, it is desirable that a thickness of the Ir film 3 to be formed is 1.5 μm or less.

If the thickness of the Ir film is more than 1.5 μm, defects having projection shape are occasionally generated and there is a fear that in the case of growing the diamond film on the defect-generated Ir film, projection-shaped defects are also generated on the diamond film. Accordingly, by making the thickness of the Ir film 1.5 μm or less as described above, defects can more certainly prevented from being generated in the Ir film. As a result, a single crystal diamond film of higher quality can be obtained. Moreover, it is preferable that an Ir film is such a thin film because the film has flexibility to the stress and therefore the delamination is difficult to be caused.

Next, a step (B) of pretreating a surface of the Ir film by DC plasma method, which is an optional step, is explained.

Figure 4:
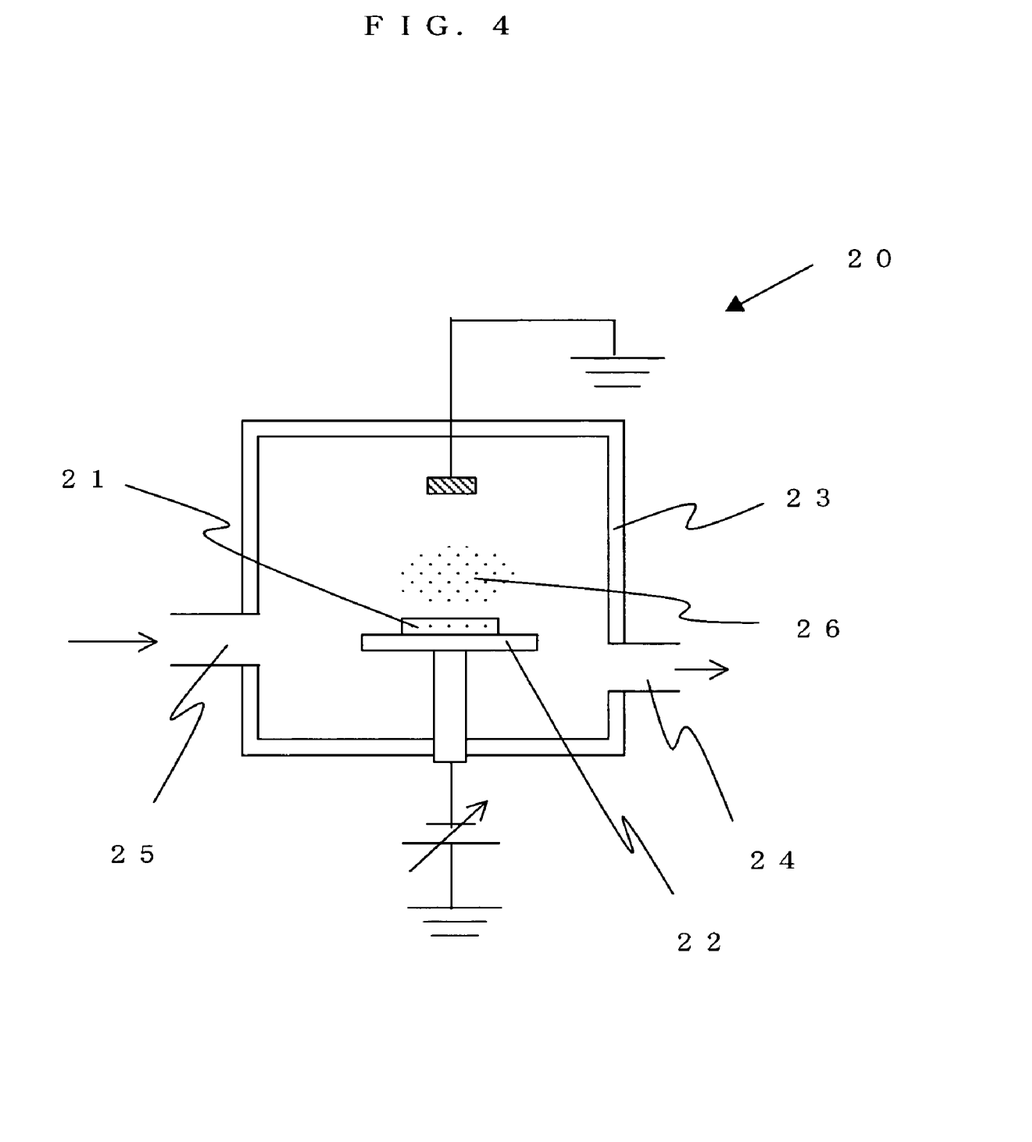
FIG. 4 is a schematic view of a pretreatment apparatus that is used in the producing method of the present invention.

As explaining the outline, a surface of the epitaxially grown Ir film is ion-irradiated by using a DC plasma apparatus 20 as shown in FIG. 4.

The detail will be explained. First, the substrate 21 that Ir is heteroepitaxially grown on the single crystal MgO substrate is set on an electrode 22 of the negative voltage-applying side and then exhaust is performed by vacuum pomp from a gas outlet duct 24 and thereby the pressure in the chamber 23 is reduced to $10^{-7}$ Torr. Next, a gas (for example, methane diluted by hydrogen: $H_2/CH_4$) is introduced from an inlet duct 25 and electric discharge is performed by applying a DC voltage to the electrode and thereby plasma 26 is generated, resulting in pretreating the surface of the Ir film of the substrate 21.

It is thought that by this pretreatment, nanosize diamond microparticles (nuclei of diamond) are formed on the surface of the Ir film. Therefore, in the subsequent step (c) of vapor-depositing a diamond film, it becomes easy to deposit the diamond film on the Ir film.

Last, the step (c) of vapor-depositing a diamond film will be explained.

Figure 5:
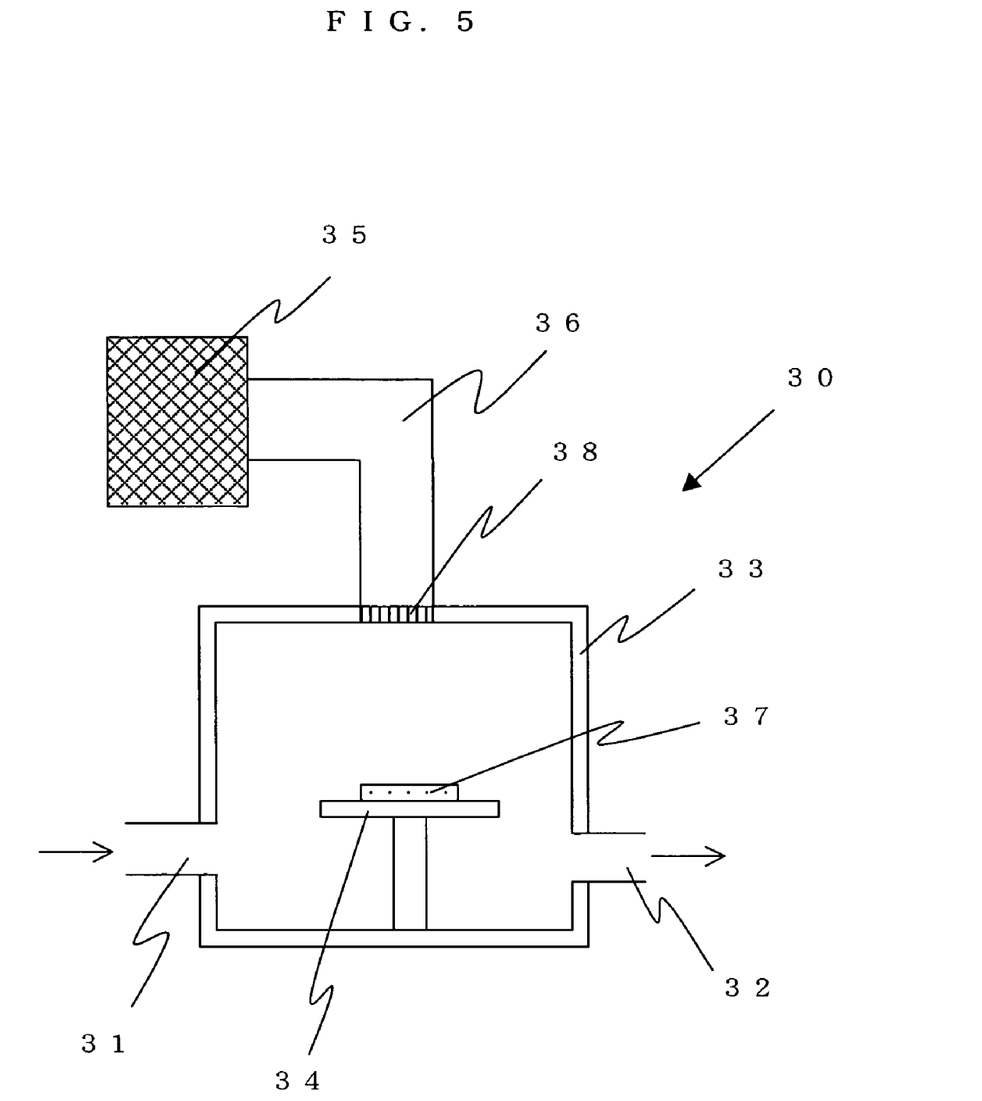
FIG. 5 is a schematic view of a microwave CVD apparatus used in the producing method of the present invention.

As explaining the outline, a diamond film is vapor-deposited on the Ir film by using a microwave CVD apparatus 30 as shown in FIG. 5.

The detail will be explained. In this microwave CVD apparatus 30, a stage 34 loaded with a heating body such as a heater is placed in a chamber 33 having a gas inlet duct 31 and a gas outlet duct 32. A microwave power source 35 is connected with a microwave guide window 38 through a waveguide 36 so that plasma can be generated in the chamber 33.

For performing vapor deposition of a diamond film by using the microwave CVD apparatus 30, a MgO substrate 37 on which the Ir film is epitaxially grown is placed on the stage 34, and then the inside of the chamber 33 is exhausted by a rotary pump and thereby the pressure in the chamber 33 is reduced to $10^{-3}$ Torr (about $1.3\times10^{-1}$ Pa) or less. Next, a desired flow amount of a material gas such as a methane gas diluted by hydrogen is introduced in the chamber 33 from an gas inlet duct 31. Next, after a bulb of a gas outlet duct 32 is adjusted and thereby the inside of the chamber 33 is made to become a desired pressure, microwave is applied from a microwave power source 35 and a waveguide 36 and thereby plasma is generated in the chamber 33, resulting in heteroepi-taxially growing the diamond film on the substrate 37.

In addition, if it is attempt to form a diamond film by DC plasma method, the substrate temperature reaches 1100° C. to 1400° C. and there is a fear that the diamond film is delaminated due to the linear expansion difference between the layers of MgO and Ir. By contrast, plasma and the substrate temperature can be controlled with relative independence by using microwave CVD method. Therefore, it is easy that a diamond film is vapor-deposited and the temperature is set to 800-1000° C., which is such a substrate temperature in the film-forming that the delamination is more difficult to be caused. In this case, the frequency may be 2.45 GHz or 915 MHz.

Such a microwave CVD method can be used for even a large substrate size of a 10-mm square or more.

EXAMPLES

Hereinafter, the present invention will be more specially explained by showing Examples and Comparative Examples. However, the present invention is not limited to these.

Example 1

As the substrate, there was prepared a double-side polished single crystal MgO having a 10.0-mm square, a 0.5-mm thickness, and an orientation (100).

An Ir film was heteroepitaxially grown on the side of this MgO substrate on which a diamond film is formed.

The Ir film was grown on the MgO substrate 11 by R.F. (13.56 MHz) magnetron sputter method by using a sputter apparatus 10 as shown in FIG. 3.

Here, as a target electrode material 12, there was used an Ir having a 6-inch (150 mm) diameter, a 5-mm thickness, and a purity of 99.9% or more. The MgO substrate 11 was heated to 800° C. and the base pressure was confirmed to become $6\times10^{-7}$ Torr (about $7.8\times10^{-5}$ Pa) or less and then an Ar gas was introduced from the gas inlet duct 16 at 10 sccm. After the opening degree of a bulb led to the gas outlet duct 15 was adjusted and thereby the pressure inside the chamber 14 was made to become $5\times10^{-2}$ Torr (about 6.5 Pa), R.F. power 1000 W was applied and thereby film-forming of the Ir film was performed for 15 minutes.

The crystallinity of the obtained Ir film was that a full width at half maximum (FWHM) of a diffracted intensity peak in $2\theta=46.5°$ attributed to Ir (200) analyzed by X-ray diffraction method with a wavelength of $\lambda=1.54$ Å was 0.30°. Moreover, calculated from the variation of the substrate warpage before and after the film-forming, the stress of the Ir film was a compression stress of 3300 MPa. Furthermore, as a result of a sectional SEM observation, the thickness of the Ir film was 0.7 µm.

Next, for forming nuclei of diamond on a surface of the Ir film, pretreatment by DC plasma method was performed.

Here, there was used a DC plasma apparatus 20 as shown in FIG. 4. First, the substrate 21 which was obtained by heteroepitaxially growing Ir on the single crystal MgO substrate was placed on a negative voltage-applying electrode 22 of a 14-mm square and of a flat plate type, and it was confirmed that pressure was made to become a base pressure of $1\times10^{-6}$ Torr (about $1.3\times10^{-4}$ Pa) or less. Then, methane diluted by hydrogen ($CH_4/(CH_4+H_2)$=2.0 vol. %) was introduced at 500 sccm from the gas inlet duct 25. Next, after the opening degree of a bulb led to the gas outlet duct 24 was adjusted and thereby the pressure was made to become 100 Torr (about $1.3\times10^4$ Pa), −500 V was applied to the electrode in the side of the substrate and the substrate 21 was exposed by plasma 26 for 1 min and thereby a surface of the Ir film of the substrate 21 was pretreated. In this case, because the current density was low and furthermore the time for the exposure was short, the substrate temperature rose only to about 500° C.

Last, the diamond film was vapor-deposited on the Ir film by microwave (2.45 GHz) CVD method.

Here, there was used a microwave CVD apparatus 30 as shown in FIG. 5. First, the pretreated substrate 37 was set in the chamber 33 of the microwave CVD apparatus 30 and then exhaust is performed by a rotary pomp through the gas outlet duct 32 to a base pressure of $10^{-3}$ Torr (about $1.3\times10^{-1}$ Pa) or less. Then, methane diluted by hydrogen ($CH_4/(CH_4+H_2)$=3.0 vol. %) served as a raw material gas was introduced at 1000 sccm from the gas inlet duct 31. Next, after the opening degree of a bulb led to the gas outlet duct 32 was adjusted and thereby the pressure was made to become 110 Torr (about $1.4\times10^4$ Pa) in the chamber 33, microwave having a power of 3000 W was applied and vapor deposition of the diamond film was performed for ten hours. Measured by a pyrometer, the substrate temperature during the film-forming was 880° C.

The obtained diamond film was a perfect continuous film without delamination in the entire surface of the substrate having a 10-mm square. As a result of a SEM observation, it was found that the film-thickness of the diamond film was 3.5 µm. Moreover, it was found that this diamond film was heteroepitaxial diamond by the SEM observation and by X-ray diffraction (θ-2 θ, pole figures) Furthermore, as a result of evaluation by raman spectroscopic analysis, it was confirmed that the film was a high-purity diamond containing no components of non-diamond.

Example 2

Except for making the Ar gas pressure $3\times10^{-2}$ Torr (about 3.9 Pa) when the Ir film was grown on the MgO substrate by R.F. magnetron sputter method, the growth of the Ir film was performed in a condition similar to that in Example 1.

The crystallinity of the obtained Ir film was that a full width at half maximum (FWHM) of a diffracted intensity peak in 2θ=46.5° attributed to Ir (200) analyzed by X-ray diffraction method with a wavelength of λ=1.54 Å was 0.36°. Moreover, calculated from the variation of the substrate warpage before and after the film-forming, the stress of the Ir film was a compression stress of 9500 MPa. Furthermore, as a result of a sectional SEM observation, the thickness of the Ir film was 0.7 µm.

Thereafter, the pretreatment and the vapor deposition of a diamond film were performed in a manner similar to Example 1.

After the vapor deposition of a diamond film, the substrate was took out from the chamber and the diamond film was investigated. Accordingly, it was found that this diamond film was heteroepitaxial diamond by the SEM observation and by X-ray diffraction (θ-2 θ, pole figures). Furthermore, as a result of evaluation by raman spectroscopic analysis, it was confirmed that the film was a high-purity diamond containing no components of non-diamond.

Example 3

Except for making the Ar gas pressure $1\times10^{-1}$ Torr (about $1.3\times10$ Pa) when the Ir film was grown on the MgO substrate by R.F. magnetron sputter method, the growth of the Ir film was performed in a condition similar to that in Example 1.

The obtained crystallinity of the Ir film was that a full width at half maximum (FWHM) of a diffracted intensity peak in 2θ=46.5° attributed to Ir (200) analyzed by X-ray diffraction method with a wavelength of λ=1.54 Å was 0.4°. Moreover, calculated from the variation of the substrate warpage before and after the film-forming, the stress of the Ir film was a compression stress of 1900 MPa. Furthermore, as a result of a sectional SEM observation, the thickness of the Ir film was 0.7 µm.

Thereafter, the pretreatment and the vapor deposition of a diamond film were performed in a manner similar to Example 1.

After the vapor deposition of a diamond film, the substrate was took out from the chamber and the diamond film was investigated. Accordingly, it was found that this diamond film was heteroepitaxial diamond by the SEM observation and by X-ray diffraction (θ-2θ, pole figures). Furthermore, as a result of evaluation by raman spectroscopic analysis, it was confirmed that the film was a high-purity diamond containing no components of non-diamond.

Example 4

Except for making the substrate temperature 600° C. when the Ir film was grown on the MgO substrate by R.F. magnetron sputter method, the growth of the Ir film was performed in a condition similar to that in Example 1.

The crystallinity of the obtained Ir film was that a full width at half maximum (FWHM) of a diffracted intensity peak in 2θ=46.5° attributed to Ir (200) analyzed by X-ray diffraction method with a wavelength of λ=1.54 Å was 0.4°. Moreover, calculated from the variation of the substrate warpage before and after the film-forming, the stress of the Ir film was a compression stress of 5200 MPa. Furthermore, as a result of a sectional SEM observation, the thickness of the Ir film was 0.7 µm.

Thereafter, the pretreatment and the vapor deposition of a diamond film were performed in a manner similar to Example 1.

After the vapor deposition of a diamond film, the substrate was took out from the chamber and the diamond film was investigated. Accordingly, it was found that this diamond film was heteroepitaxial diamond by the SEM observation and by X-ray diffraction (θ-2θ, pole figures). Furthermore, as a result of evaluation by raman spectroscopic analysis, it was confirmed that the film was a high-purity diamond containing no components of non-diamond.

Example 5

Except for making the substrate temperature 1000° C. when the Ir film was grown on the MgO substrate by R.F.

magnetron sputter method, the growth of the Ir film was performed in a condition similar to that in Example 1.

The crystallinity of the obtained Ir film was that a full width at half maximum (FWHM) of a diffracted intensity peak in 2θ=46.5° attributed to Ir (200) analyzed by X-ray diffraction method with a wavelength of λ=1.54 Å was 0.35°. Moreover, calculated from the variation of the substrate warpage before and after the film-forming, the stress of the Ir film was a compression stress of 10000 MPa. Furthermore, as a result of a sectional SEM observation, the thickness of the Ir film was 0.7 μm.

Thereafter, the pretreatment and the vapor deposition of a diamond film were performed in a manner similar to Example 1.

After the vapor deposition of a diamond film, the substrate was took out from the chamber and the diamond film was investigated. Accordingly, it was found that this diamond film was heteroepitaxial diamond by the SEM observation and by X-ray diffraction (θ-2θ, pole figures). Furthermore, as a result of evaluation by raman spectroscopic analysis, it was confirmed that the film was a high-purity diamond containing no components of non-diamond.

Comparative Example 1

Except for making the Ar gas pressure 1×10⁻² Torr (about 1.3 Pa) when the Ir film was grown on the MgO substrate by R.F. magnetron sputter method, the growth of the Ir film was performed in a condition similar to that in Example 1.

The crystallinity of the obtained Ir film was that a full width at half maximum (FWHM) of a diffracted intensity peak in 2θ=46.5° attributed to Ir (200) analyzed by X-ray diffraction method with a wavelength of λ=1.54 Å was 0.49°. Moreover, calculated from the variation of the substrate warpage before and after the film-forming, the stress of the Ir film was a compression stress of 20000 MPa. Furthermore, as a result of a sectional SEM observation, the thickness of the Ir film was 0.7 μm.

Thereafter, the pretreatment and the vapor deposition of a diamond film were performed in a manner similar to Example 1.

After the vapor deposition of a diamond film, the substrate was took out from the chamber and the diamond film was observed. It was observed that cracks had already been generated to crumble the diamond film into a size of about several millimeters respectively on the entire surface of the substrate and delamination was caused at the interface between the MgO substrate and the Ir film.

Comparative Example 2

Except for making the Ar gas pressure 2×10⁻¹ Torr (about 2.6×10 Pa) when the Ir film was grown on the MgO substrate by R.F. magnetron sputter method, the growth of the Ir film was performed in a condition similar to that in Example 1.

The crystallinity of the obtained Ir film was that a full width at half maximum (FWHM) of a diffracted intensity peak in 2θ=46.5° attributed to Ir (200) analyzed by X-ray diffraction method with a wavelength of λ=1.54 Å was 0.5°. Moreover, calculated from the variation of the substrate warpage before and after the film-forming, the stress of the Ir film was a compression stress of 2000 MPa. Furthermore, as a result of a sectional SEM observation, the thickness of the Ir film was 0.7 μm.

Thereafter, the pretreatment and the vapor deposition of a diamond film were performed in a manner similar to Example 1.

After the vapor deposition of a diamond film, the substrate was took out from the chamber and the diamond film was observed. Therefore, in the diamond film, it was observed that defects having projection shape are generated.

Comparative Example 3

Except for making the substrate temperature 1100° C. when the Ir film was grown on the MgO substrate by R.F. magnetron sputter method, the growth of the Ir film was performed in a condition similar to that in Example 1.

The crystallinity of the obtained Ir film was that a full width at half maximum (FWHM) of a diffracted intensity peak in 2θ=46.5° attributed to Ir (200) analyzed by X-ray diffraction method with a wavelength of μ=1.54 Å was 0.3°. Moreover, calculated from the variation of the substrate warpage before and after the film-forming, the stress of the Ir film was a compression stress of 20000 MPa. Furthermore, as a result of a sectional SEM observation, the thickness of the Ir film was 0.7 μm.

Thereafter, the pretreatment and the vapor deposition of a diamond film were performed in a manner similar to Example 1.

After the vapor deposition of a diamond film, the substrate was took out from the chamber and the diamond film was observed. It was observed that cracks had already been generated to crumble the diamond film into a size of about several millimeters respectively on the entire surface of the substrate and delamination was caused at the interface between the MgO substrate and the Ir film.

Comparative Example 4

Except for making the substrate temperature 400° C. when the Ir film was grown on the MgO substrate by R.F. magnetron sputter method, the growth of the Ir film was performed in a condition similar to that in Example 1.

The crystallinity of the obtained Ir film was that a full width at half maximum (FWHM) of a diffracted intensity peak in 2θ=46.5° attributed to Ir (200) analyzed by X-ray diffraction method with a wavelength of λ=1.54 Å was 0.6°. Moreover, calculated from the variation of the substrate warpage before and after the film-forming, the stress of the Ir film was a compression stress of 7000 MPa. Furthermore, as a result of a sectional SEM observation, the thickness of the Ir film was 0.7 μm.

Thereafter, the pretreatment and the vapor deposition of a diamond film were performed in a manner similar to Example 1.

After the vapor deposition of a diamond film, the substrate was took out from the chamber and the diamond film was investigated. Accordingly, it was found that this obtained diamond film was polycrystalline diamond by the SEM observation and by X-ray diffraction (θ-2θ, pole figures).

Film-forming conditions and results of Examples 1-5 and Comparative Examples 1-4 were summarized in the table.

TABLE 1

| | The Substrate Temperature during the Ir Film Growth (° C.) | Ar Gas Pressure during the Ir Film Growth (Torr) | Ir Film Thickness (μm) | Ir Film Stress (MPa) | Ir (200) Peak FWHM (deg) | Diamond Film Quality |
|---|---|---|---|---|---|---|
| Example 1 | 800 | $5 \times 10^{-2}$ | 0.7 | $3.3 \times 10^3$ | 0.3 | Good Single Crystal Diamond |
| Example 2 | 800 | $3 \times 10^{-2}$ | 0.7 | $9.5 \times 10^3$ | 0.36 | Good Single Crystal Diamond |
| Example 3 | 800 | $1 \times 10^{-1}$ | 0.7 | $1.9 \times 10^3$ | 0.4 | Good Single Crystal Diamond |
| Example 4 | 600 | $5 \times 10^{-2}$ | 0.7 | $5.2 \times 10^3$ | 0.4 | Good Single Crystal Diamond |
| Example 5 | 1000 | $5 \times 10^{-2}$ | 0.7 | $1 \times 10^4$ | 0.35 | Good Single Crystal Diamond |
| Comparative Example 1 | 800 | $1 \times 10^{-2}$ | 0.7 | $2 \times 10^4$ | 0.49 | Delamination |
| Comparative Example 2 | 800 | $2 \times 10^{-1}$ | 0.7 | $2 \times 10^3$ | 0.5 | Generation of Defects Having Projection Shape |
| Comparative Example 3 | 1100 | $5 \times 10^{-2}$ | 0.7 | $2 \times 10^4$ | 0.3 | Delamination |
| Comparative Example 4 | 400 | $5 \times 10^{-2}$ | 0.7 | $7 \times 10^3$ | 0.6 | Polycrystalline Diamond |

From Table 1, it is found that if the condition when an Ir film is grown is that the substrate temperature is 600-1000° C. and an Ar gas pressure is $3 \times 10^{-2}$-$1 \times 10^{-1}$ Torr, an Ir film having good crystallinity and moderate film stress can be grown. And, it is found that by vapor-depositing a diamond film on such an Ir film, a single crystal diamond film of high quality can be obtain even if the diamond film has a large area of a 10-mm square.

The present invention is not limited to the embodiments described above. The above-described embodiments are examples and those having substantially the same constitution as technical ideas described in the claims of the present invention and providing the similar functions and advantages are included in the scope of the present invention.

What is claimed is:

1. A multilayer substrate comprising, at least, a single crystal MgO substrate, an iridium (Ir) film heteroepitaxially grown on the MgO substrate, and a diamond film vapor-deposited on the Ir film, wherein crystallinity of the Ir film is that a full width at half maximum (FWHM) of a diffracted intensity peak in 2θ=46.5° or 2θ=47.3° attributed to Ir (200) analyzed by X-ray diffraction method with a wavelength of λ=1.54 Å is 0.40° or less, and a stress in the Ir film is a compression stress of $1 \times 10^2$-$1 \times 10^4$ MPa.

2. The multilayer substrate according to claim 1, wherein a thickness of the Ir film is 1.5 μm or less.

3. A device produced by using the multilayer substrate according to claim 1.

4. A device produced by using the multilayer substrate according to claim 2.

5. A method for producing a multilayer substrate comprising, at least, a step of heteroepitaxially growing an iridium (Ir) film on a MgO substrate and a step of vapor-depositing a diamond film on the Ir film, wherein the heteroepitaxial growth of the Ir film is performed by R.F. magnetron sputter method in a condition that the target is Ir, the substrate temperature is 600-1000 ° C., and the gas pressure is $3 \times 10^{-2}$-$1 \times 10^{-1}$ Torr, and wherein crystallinity of the Ir film is that a full width at half maximum (FWHM) of a diffracted intensity peak in 2θ=46.5° or 2θ=47.3° attributed to Ir (200) analyzed by X-ray diffraction method with a wavelength of λ=1.54 Å is 0.40° or less, and a stress in the Ir film is a compression stress of $1 \times 10^2$-$1 \times 10^4$ MPa.

6. The method for producing a multilayer substrate according to claim 5, wherein a thickness of the Ir film to be heteroepitaxially grown is 1.5 μm or less.

7. The method for producing a multilayer substrate according to claim 5, wherein the vapor deposition of a diamond film is performed by a microwave CVD method in a condition that the substrate temperature is 800-1000° C.

8. The method for producing a multilayer substrate according to claim 6, wherein the vapor deposition of a diamond film is performed by a microwave CVD method in a condition that the substrate temperature is 800-1000° C.

9. The method for producing a multilayer substrate according to claim 5, wherein after the step of the heteroepitaxial growth of an Ir film, a surface of the Ir film is pretreated by DC plasma method before the step of the vapor deposition of a diamond film.

10. The method for producing a multilayer substrate according to claim 6, wherein after the step of the heteroepitaxial growth of an Ir film, a surface of the Ir film is pretreated by DC plasma method before the step of the vapor deposition of a diamond film.

11. The method for producing a multilayer substrate according to claim 7, wherein after the step of the heteroepitaxial growth of an Ir film, a surface of the Ir film is pretreated by DC plasma method before the step of the vapor deposition of a diamond film.

12. The method for producing a multilayer substrate according to claim 8, wherein after the step of the heteroepitaxial growth of an Ir film, a surface of the Ir film is pretreated by DC plasma method before the step of the vapor deposition of a diamond film.

* * * * *